(12) United States Patent
TeWinkle

(10) Patent No.: US 8,300,286 B2
(45) Date of Patent: Oct. 30, 2012

(54) PHOTOSENSITIVE CHIP WITH SHIFTED ROWS OF PHOTOSENSORS AND METHODS THEREOF

(75) Inventor: Scott L. TeWinkle, Ontario, NY (US)

(73) Assignee: Xerox Corporation, Norwalk, CT (US)

( * ) Notice: Subject to any disclaimer, the term of this patent is extended or adjusted under 35 U.S.C. 154(b) by 476 days.

(21) Appl. No.: 12/496,358

(22) Filed: Jul. 1, 2009

(65) Prior Publication Data

US 2011/0002017 A1   Jan. 6, 2011

(51) Int. Cl.
*H04N 1/04* (2006.01)
*H04N 1/46* (2006.01)

(52) U.S. Cl. ........ 358/482; 358/445; 358/443; 358/512; 358/513; 358/514

(58) Field of Classification Search .......................... None
See application file for complete search history.

(56) References Cited

U.S. PATENT DOCUMENTS

| | | | |
|---|---|---|---|
| 5,105,277 A | | 4/1992 | Hayes et al. |
| 5,452,001 A | * | 9/1995 | Hosier et al. ............... 348/230.1 |
| 5,488,239 A | * | 1/1996 | Jung .............................. 257/231 |
| 6,166,831 A | * | 12/2000 | Boyd et al. ..................... 358/483 |
| 6,570,615 B1 | * | 5/2003 | Decker et al. ................. 348/272 |
| 6,917,026 B2 | * | 7/2005 | Yasuda et al. .............. 250/208.1 |
| 6,961,158 B2 | * | 11/2005 | Spears .......................... 358/513 |
| 7,129,461 B2 | * | 10/2006 | Zarnowski et al. ......... 250/208.1 |
| 7,349,129 B2 | * | 3/2008 | Spears et al. .................. 358/445 |
| 7,554,067 B2 | * | 6/2009 | Zarnowski et al. ........ 250/208.1 |

\* cited by examiner

*Primary Examiner* — Cheukfan Lee
(74) *Attorney, Agent, or Firm* — Simpson & Simpson, PLLC

(57) ABSTRACT

A photosensitive chip, including first and second sets of photosensors aligned in a Y direction and separated in a perpendicular X direction and third and fourth sets of photosensors aligned in the Y direction and separated in the X direction. The first and third sets are aligned in the X direction. The second and fourth sets are aligned in the X direction. The first and third sets are offset in the Y direction from the second and fourth sets by a distance about equal to a length of a photosensor divided by the number of sets. A time interval between activation of two sequential photosensors from the first through fourth sets of photosensors is substantially equal to the time period of a scan line for the first through fourth sets of photosensors divided by the number of photosensors in the first through fourth sets of photosensors.

14 Claims, 8 Drawing Sheets

PHOTOSENSITIVE CHIP WITH SHIFTED ROWS OF PHOTOSENSORS AND METHODS THEREOF

TECHNICAL FIELD

The present disclosure relates to use of multiple rows of photosensors with a single amplifier in a photosensitive chip.

BACKGROUND

FIG. 5 is a block diagram of apparatus 400 with full width array sensor 402 with photosensitive chip 404. The apparatus also includes computing device 406, memory element 408, and processor 410. The memory element is for storing light-induced signals from the plurality of sets of photosensors and the processor is for retrieving the signals and operating upon the signals to generate an image.

FIG. 6 is a plan view of first prior art portion 500 of a first photosensitive chip. The architecture for portion 500 includes set of at least one electrical element 502, pixel amplifier 504, shift register 506 and a single set 508 of photosensors 510 for each pixel amplifier, aligned in direction Y. The electrical element receives respective light-induced signals from the photosensor, for example, photosensors 510. In an example embodiment, set 502 is similar to transfer circuit 20 described in commonly owned U.S. Pat. No. 5,105,277, the disclosure of which is incorporated herein by reference in its entirety. In one example, portion 500 is designed to support a resolution of 600 spots per inch (SPI). This resolution is related to width 512 of the photosensors. Element 502, pixel amplifier 504, and shift register 506 have width 514.

FIG. 7 is a plan view of second prior art portion 600, different than portion 500 in FIG. 6, of a second photosensitive chip. To increase resolution for a photosensitive chip, the prior art teaches reducing the width of photosensors and increasing the length of associated circuitry, such as the amplifier and shift register. For example, the architecture of portion 500 is not suitable for supporting higher resolutions according to teachings of the prior art. Portion 600 includes set of at least one electrical element 602, pixel amplifier 604, shift register 606 and a single set 608 of photosensors 610 for each pixel amplifier. To support a resolution of 1200 SPI, the architecture of portion 600 in FIG. 7 differs from that for portion 500 in FIG. 6, for example, width 612 of the photosensors in FIG. 7 is reduced to about half of width 512 of the photosensors in FIG. 6, and width 614 of the pixel amplifiers in FIG. 7 is reduced to about half of width 514 of the pixel amplifiers in FIG. 6. However, the reduction in width 614 results in a subsequent increase of over 50% for length 616 with respect to length 516. The increase in length 616 is undesirable, as this increase causes a subsequent increase in the dimensions for a chip including portion 600. For example, such an increase in chip dimensions can render a chip that is suitable for a 600 SPI resolution unusable for a 1200 SPI resolution, with the result that another larger and more likely costly chip must be used, or time and expense must be committed to designing and fabricating a chip suitable for portion 600.

SUMMARY

According to aspects illustrated herein, there is provided a photosensitive chip, including: a plurality of sets of photosensors arranged along an X direction, the photosensors within each set of photosensors aligned in a Y direction, perpendicular to the X direction, and the photosensors within said each set being off-set, in the Y direction, relative to the photosensors of an adjacent set of photosensors by a distance less than a length of a photosensor. In an example embodiment, the plurality of sets of photosensors includes a first number of sets and the distance is about equal to the length of a photosensor divided by the first number. In an example embodiment, the plurality of sets of photosensors includes a first number of photosensors; a scan line for the plurality of sets of photosensors has a time period; respective photosensors in the plurality of sets of photosensors are activated in sequence to begin accumulating charge with respect to incident light thereon; and a time interval between activation of two sequential photosensors in the sequence is substantially equal to the time period divided by the first number.

In an example embodiment, the plurality of sets of photosensors includes a first number of photosensors; a scan line for the plurality of sets of photosensors has a time period; a first photosensor in the plurality of sets of photosensors is activated at the beginning of the time period to begin accumulating charge with respect to incident light thereon; and activation of the remaining photosensors in the plurality of sets of photosensors to begin accumulating charge with respect to incident light thereon is delayed by a time interval substantially equal to a multiple of the time period divided by the first number.

In an example embodiment, the chip includes: a pixel amplifier electrically connected to the plurality of sets of photosensors; at least one multiplexing circuit electrically connected to the plurality of sets of photosensors; and at least one electrical element connected to the at least one multiplexing circuit and to the pixel amplifier. The at least one multiplexing circuit is for selecting respective light-induced signals from the photosensors in a predetermined sequence and transmitting the respective light-induced signals to the pixel amplifier via the at least one electrical element. In an example embodiment, respective lines extending in the Y direction from respective outside edges of the pixel amplifier bracket the plurality of sets of photosensors.

In an example embodiment, the plurality of sets of photosensors includes a first number of sets; each of the photosensors in the plurality of sets of photosensors has a respective transverse width, in direction X orthogonal to direction Y, equal to a first value; and the pixel amplifier, including at least one wiring channel, has a transverse width, in the X direction, greater than the first value multiplied by the first number.

According to aspects illustrated herein, there is provided a method for processing optical data from a photosensitive chip, the chip including: a plurality of sets of photosensors arranged along an X direction, the photosensors within each set of photosensors aligned in a Y direction, perpendicular to the X direction, and the photosensors within said each set being off-set, in the Y direction, relative to the photosensors of an adjacent set of photosensors by a distance less than a length of a photosensor, the method including transmitting respective light-induced signals from the photosensors in a predetermined sequence.

In an example embodiment, the chip includes a selection element electrically connected to the plurality of sets of photosensors and a pixel amplifier electrically connected to the selection element. Transmitting respective light-induced signals from the photosensors in a predetermined sequence includes transmitting, using the selection element, respective light-induced signals from the photosensors to the pixel amplifier. In an example embodiment, the plurality of sets of photosensors includes a first number of photosensors; and a scan line for the plurality of sets of photosensors has a time period. The method includes activating each photosensor in the plurality of sets of photosensors in sequence to begin accumulating charge with respect to incident light thereon, and a time interval between activation of two sequential photosensors in the sequence is substantially equal to the time period divided by the first number.

In an example embodiment, the plurality of sets of photosensors includes a first number of photosensors; and a scan line for the plurality of sets of photosensors has a time period. The method includes: activating a first photosensor in the plurality of sets of photosensors at the beginning of the time period to begin accumulating charge with respect to incident light thereon; and delaying activation of the remaining photosensors in the plurality of sets of photosensors to begin accumulating charge with respect to incident light thereon by a time interval substantially equal to a multiple of the time period divided by the first number.

In an example embodiment, the plurality of sets of photosensors includes a plurality of groups of photosensors; each group of photosensors includes a photosensor from each set in the plurality of sets of photosensors; and a scan line for the plurality of sets of photosensors has a time period. The method includes: initiating the scan line for the plurality of sets of photosensors; and for said each of the photosensors, detecting incident light for a respective area along a process direction parallel to the Y direction, the area having a center. For each group of photosensors, a time interval, in the process direction, between respective centers for associated areas is a whole number multiple of the time period.

According to aspects illustrated herein, there is provided an apparatus for generating or reproducing a document, including: a conveyance element for transporting a sheet of material through the apparatus in a process direction; at least one photosensitive chip including a plurality of sets of photosensors arranged along an X direction, the photosensors within each set of photosensors aligned in a Y direction, perpendicular to the X direction, and the photosensors within said each set being off-set, in the Y direction, relative to the photosensors of an adjacent set of photosensors by a distance less than a length of a photosensor; and a computing device for operating upon light-induced signals from the plurality of sets of photosensors. In an example embodiment, the at least one chip includes a pixel amplifier electrically connected to the plurality of sets of photosensors. In an example embodiment, the plurality of sets of photosensors includes a first number of sets and the distance is about equal to the length of a photosensor divided by the first number. In an example embodiment, the plurality of sets of photosensors includes a first number of photosensors; a scan line for the plurality of sets of photosensors has a time period; each photosensor in the plurality of sets of photosensors is activated in sequence to begin accumulating charge with respect to incident light thereon; and a time interval between activation of two sequential photosensors in the sequence is substantially equal to the time period divided by the first number.

BRIEF DESCRIPTION OF THE DRAWINGS

Various embodiments are disclosed, by way of example only, with reference to the accompanying schematic drawings in which corresponding reference symbols indicate corresponding parts, in which.

DETAILED DESCRIPTION

Figure 1:
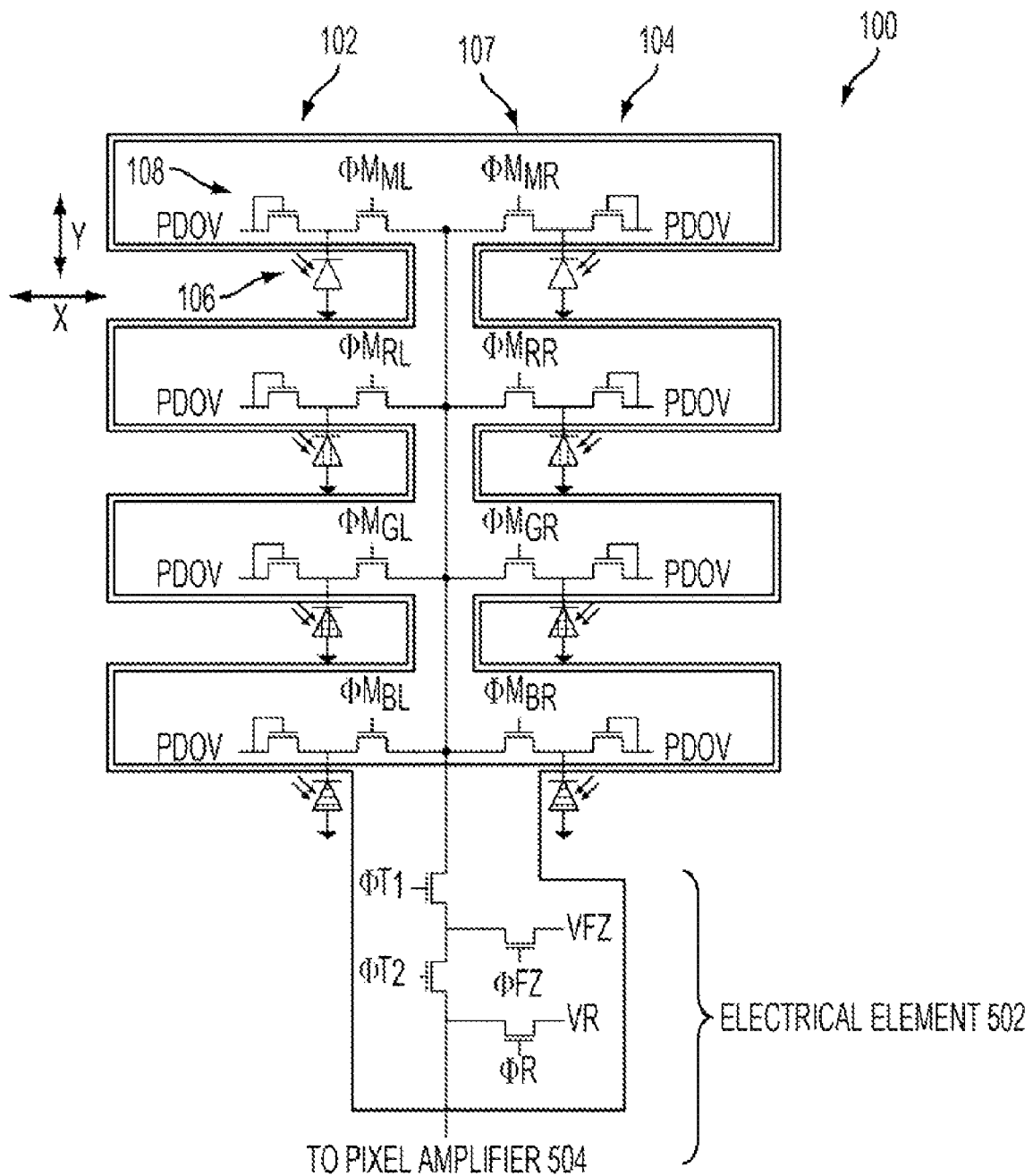
FIG. 1 is a schematic drawing of a portion of a photosensitive chip with multiple sets of photosensors connected to a pixel amplifier.
Figure 6:
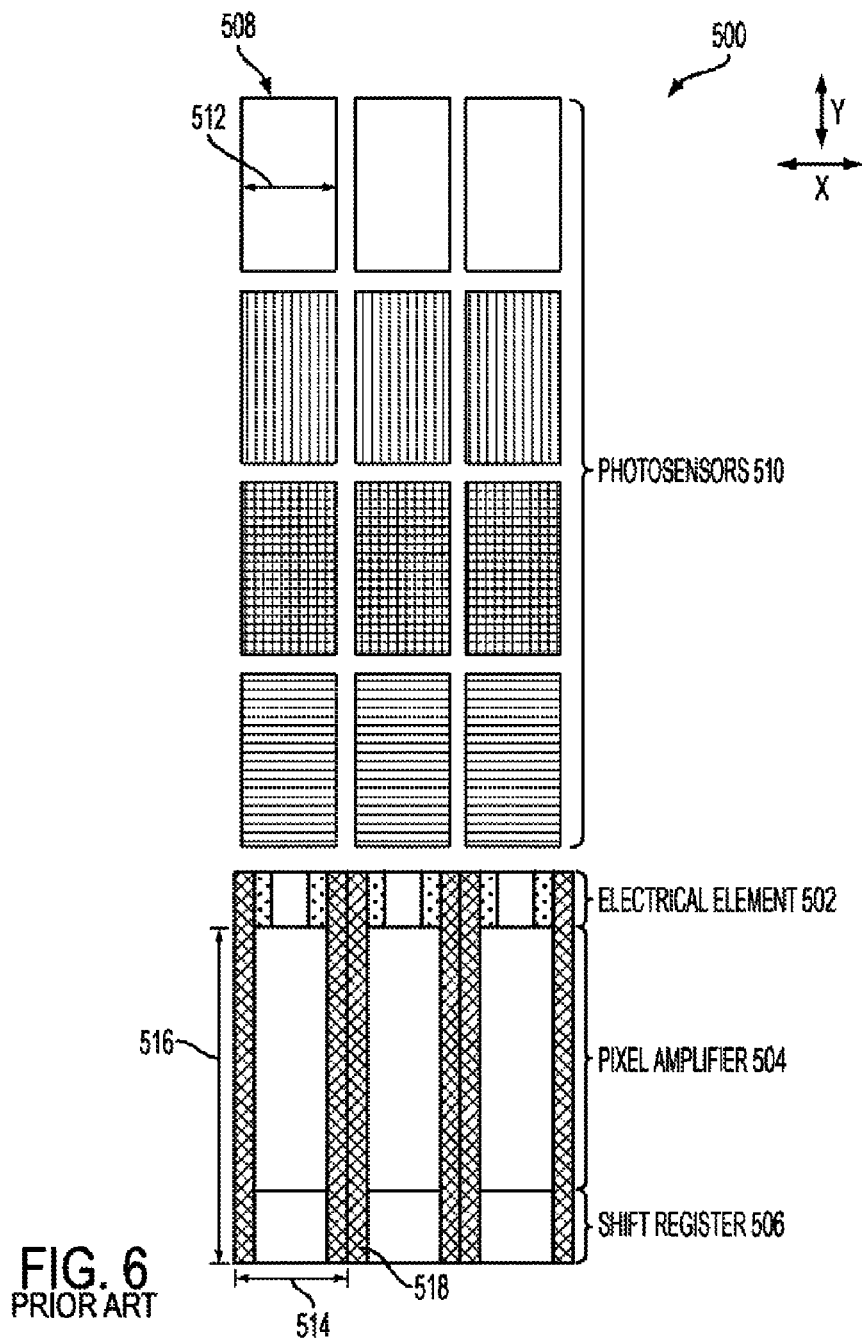
FIG. 6 is a plan view of a first prior art portion of a prior art photosensitive chip.

FIG. 1 is a schematic drawing of portion 100 of a photosensitive chip with multiple sets of photosensors connected to a pixel amplifier. In an example embodiment, portion 100 includes parts of portion 500 from FIG. 6. For example, a chip including those parts of portion 500 shown in FIG. 1 can be used as a starting point for fabricating portion 100 and the chip including portion 100. However, unlike portion 500, portion 100 includes two sets, for example, sets 102 and 104, of photosensors 106 for a single electrical element and amplifier combination.

In an example embodiment, portion 100 includes selection element 107. In an example embodiment, the selection element includes at least one multiplexing circuit 108 electrically connected to the photosensors. In an example embodiment, multiplexing circuit 108 includes respective switch circuits electrically connected to the photosensors. Multiplexing circuit 108 for selecting light-induced signals from the photosensors in a predetermined sequence and transmitting the respective light-induced signals, which are proportional to light incident upon the photosensors, to the electrical element, as further explained infra.

Figure 2:
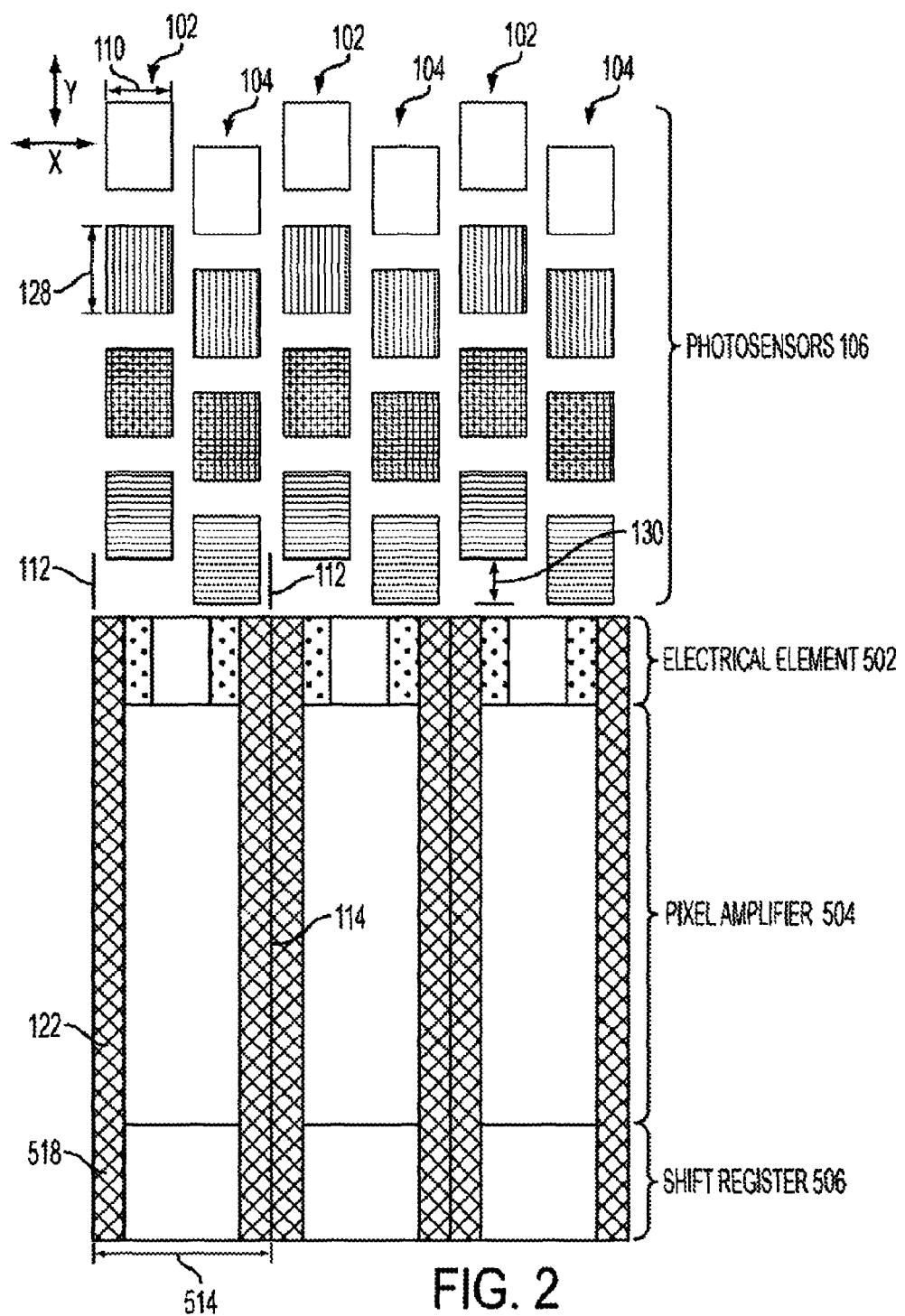
FIG. 2 is a plan view of the portion of a photosensitive chip with multiple sets of photosensors connected to a pixel amplifier shown in FIG. 1.

FIG. 2 is a plan view of portion 100 of a photosensitive chip with multiple sets of photosensors connected to a pixel amplifier shown in FIG. 1. Photosensors 106 can be any photosensors known in the art. In an example embodiment, the photosensors are photodiodes. Portion 100 includes a plurality of sets of photosensors, for example, sets 102 and 104, arranged along an X direction. The photosensors within each set of photosensors are aligned in a Y direction, perpendicular to the X direction. The photosensors within each set are off-set, in the Y direction, relative to the photosensors of an adjacent set of photosensors by a distance less than a length of a photosensor. For example, the photosensors in a set 102 are offset, in the Y direction, from photosensors in an adjacent set 104 by distance 130, less than length 128 of a photosensor. The term "off-set" and the term "offset" are used interchangeably in the present disclosure. In an example embodiment, the photosensors in each set are evenly spaced in direction Y. In an example embodiment, offset 130 between adjacent sets of photosensors is substantially equal to length 128 divided by the number of sets in the plurality of sets of photosensors, for example, in FIG. 2, two. It should be understood that other offset values and calculations can be used.

In portion 100, respective lines 112, extending in the direction Y from respective outside edges 114 of the pixel amplifier, bracket the sets of photosensors. Thus, advantageously, the increased number of photosensor sets is assimilated with the existing dimensionality of portion 500.

Figure 7:
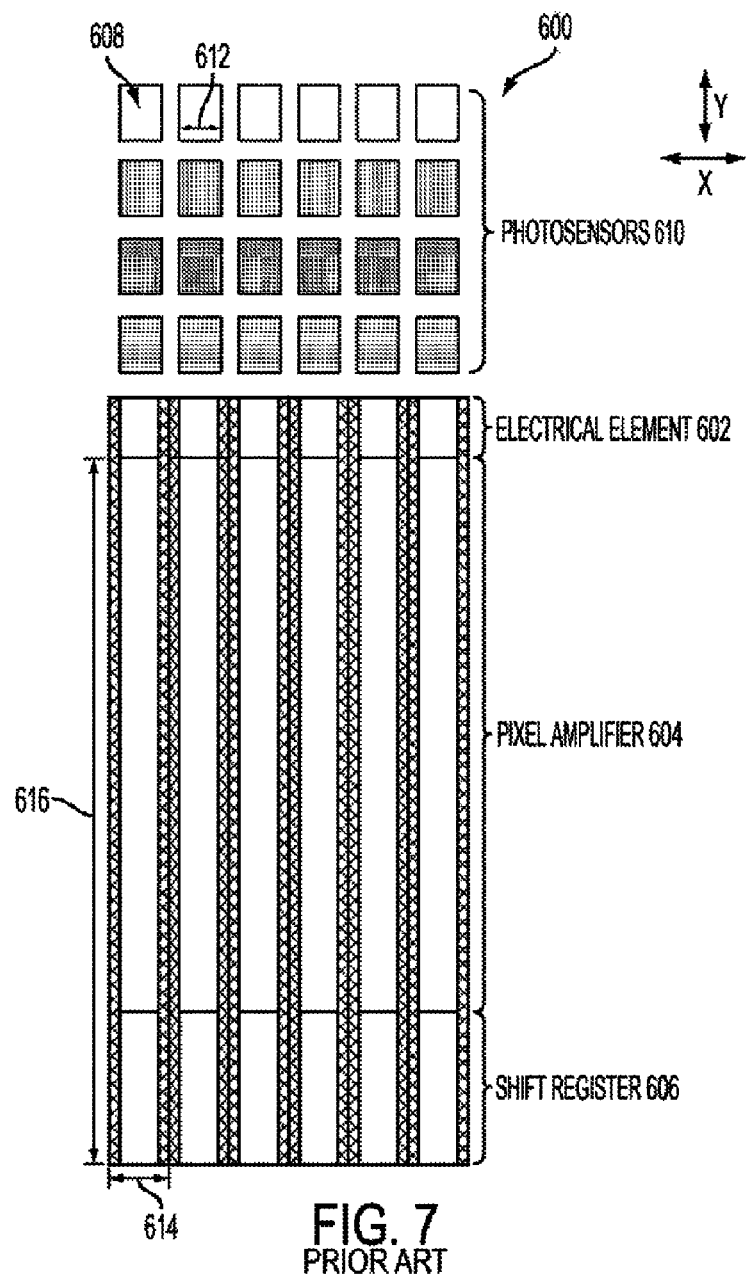
FIG. 7 is a plan view of a second prior art portion of a prior art photosensitive chip; and, FIG. 8 is a block diagram of an apparatus with a full width array sensor with photosensitive chips with multiple sets of photosensors connected to a pixel amplifier.

Portion 100 is configured to support a resolution greater than the resolution for portion 500. In an example embodiment, if portion 500 supports a resolution of 600 spots per inch (SPI), portion 100 is configured to support a resolution of 1200 SPI, for example, by sizing photosensors 106 to have respective transverse widths 110, in transverse direction X orthogonal to direction Y, about equal to width 612. However, each set 102 and 104 is able to use a single pixel amplifier. That is, portion 100 does not require an increase in the lengths, in the Y direction, of the pixel amplifier and shift register as shown for FIG. 7.

Figure 3:
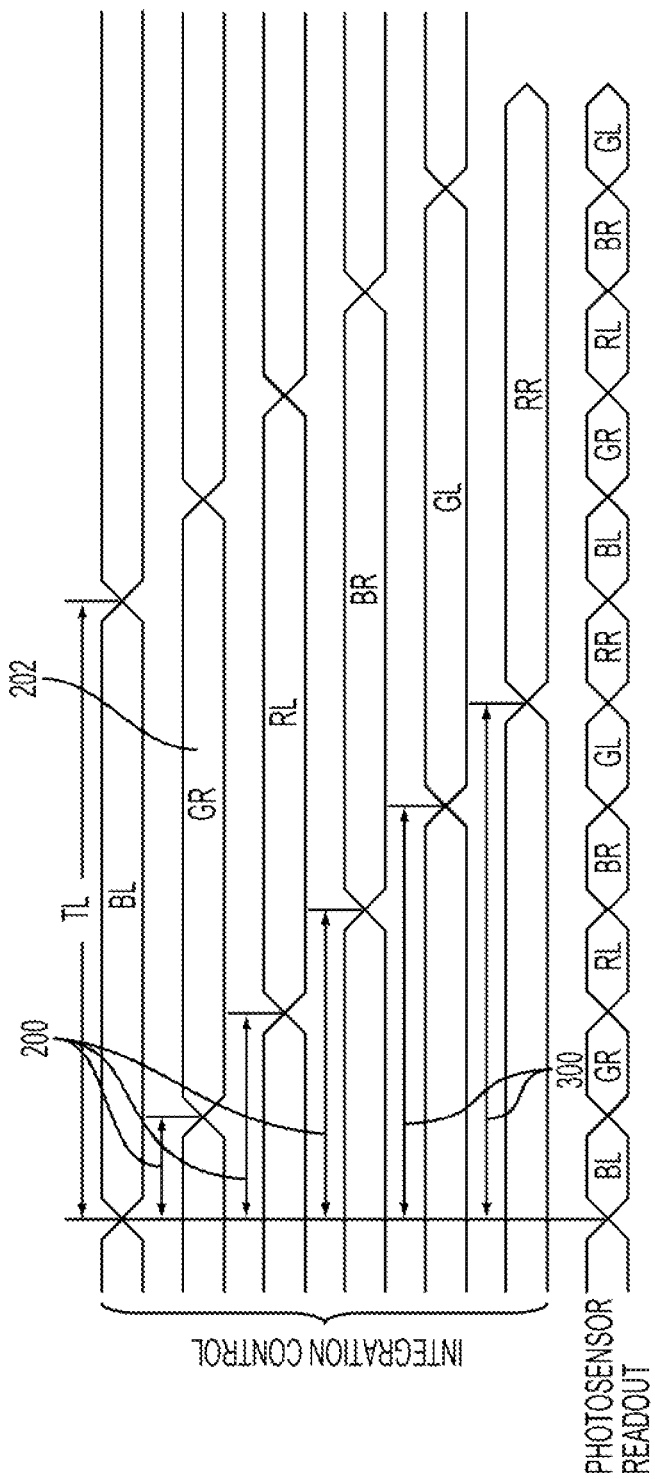
FIG. 3 is a timing diagram showing integration control for multiple sets of photosensors connected to a pixel amplifier.

FIG. 3 is a timing diagram showing integration control for multiple sets of photosensors connected to a pixel amplifier. The photosensors described in FIG. 3 are from sets 102 and 104. During scan line TL for sets 102 and 104, photosensors 106 are activated, from a starting time of the scan, to begin accumulating charge with respect to incident light on the photosensors at respective time intervals 200 substantially equal to multiples of TL divided by the number of photosensors connected to a pixel amplifier, for example, multiples of one sixth the time period for the scan. For example, intervals 200 increase by one sixth the time period for successive photosensors in the sequence shown in FIG. 3. Each photosensor 106 remains activated (integrating) for time period 202 equal to TL. In an example embodiment, the staggered activation and readout of the photosensors is accomplished with element 107. It should be understood that other sequences for activating and reading out photosensors are possible.

In an example embodiment, respective photosensors in sets 102 and 104 are filtered for individual colors, for example, individual primary colors such as red, green, and blue. In an example embodiment, photosensors 106 for set 102 are filtered for color and labeled as follows: BL (blue left), GL (green left), and RL (red left) and photosensors 106 for set 104 are filtered for color and labeled as follows: BR (blue right), GR (green right), and RR (red right). It should be understood that other numbers of photosensors in a set of photosensors, other color filtering, and other sequences of photosensors in a set are possible.

Figure 4:
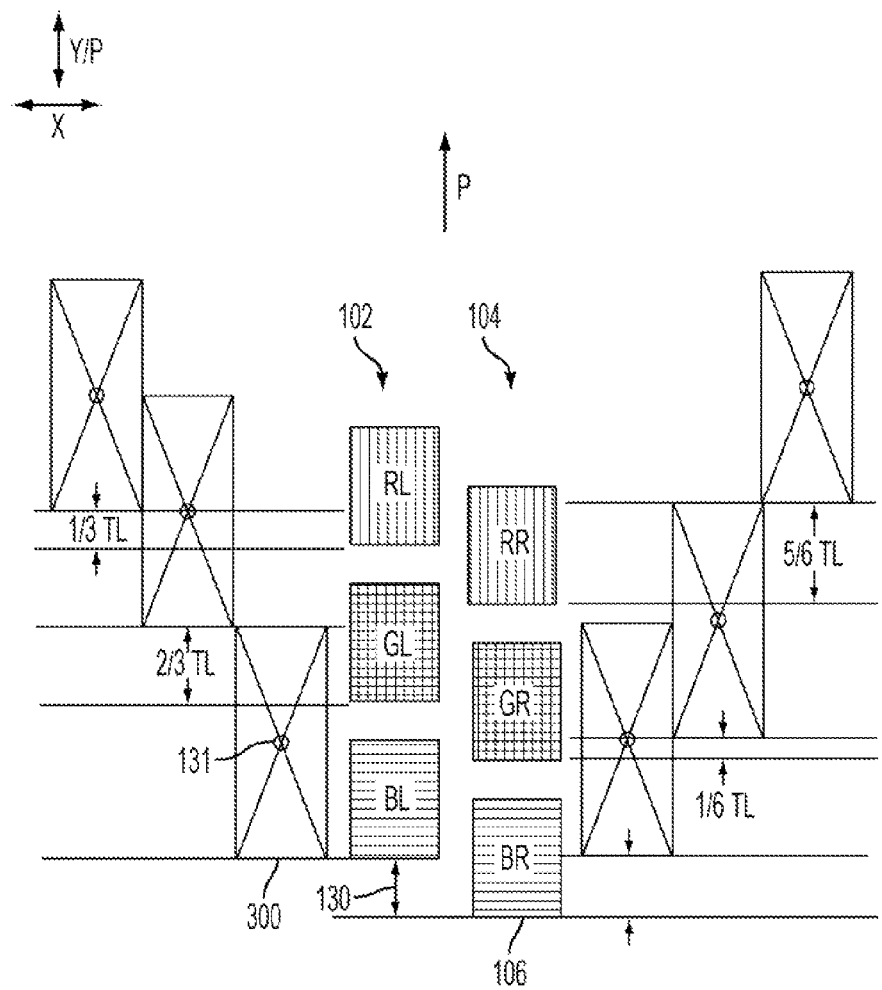
FIG. 4 is a diagrammatic rendering showing two sets of photosensors and respective integration areas.

FIG. 4 is a diagrammatic rendering showing two sets of photosensors and respective integration areas. During the time period for a scan line, each photosensor detects incident light for a respective area 300 along process direction P parallel to direction Y. In an example embodiment, a time interval, in the process direction, between respective centers 131 for the respective areas for a pair of photosensors is a whole number multiple of TL. In an example embodiment, during a scan line for sets 102 and 104, photosensors from the sets are alternately activated to begin accumulating charge with respect to incident light upon the photosensors.

Thus, according to aspects illustrated herein, photosensors in a set are shifted by a specified amount, which can be related to the number of sets of photosensors, with respect to other sets of photosensors, enabling a single pixel amplifier and shift register to be shared among the sets of photosensors, for example among adjacent photosites of color rows. A readout timing scheme is used that delays the start of signal integration so as to bring the captured images of the shifted rows into correct alignment, accounting for both the row shifts and the image scanning motion. A multiplexing scheme enables the required timing and amplifier sharing.

Figure 5:
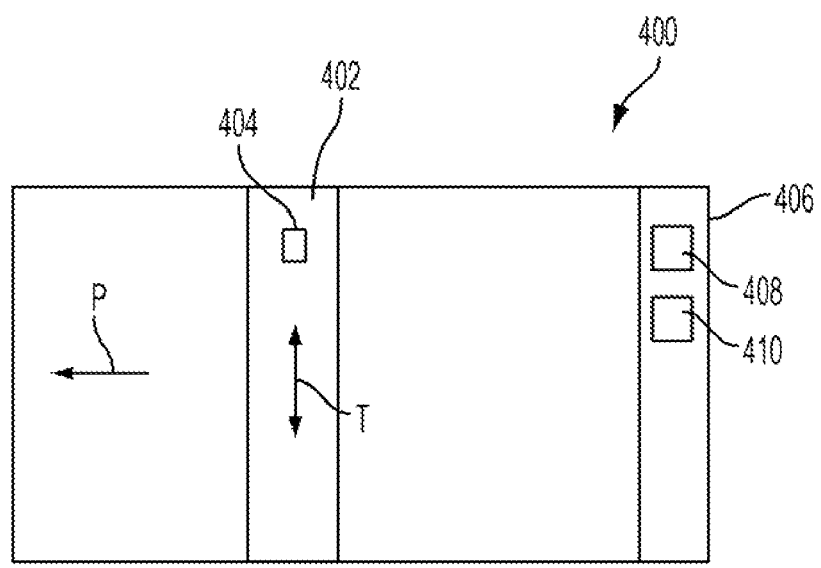
FIG. 5 is a block diagram of a prior art apparatus with a full width array sensor with a photosensitive chip.
Figure 8:
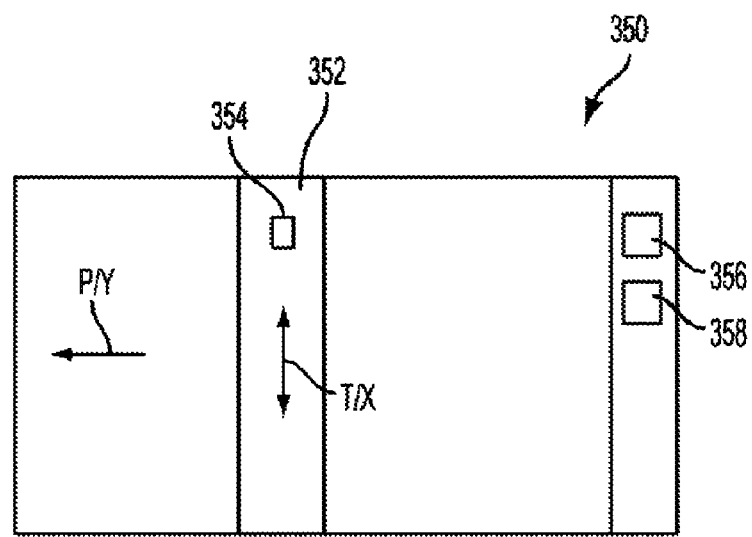

FIG. 8 is a block diagram of apparatus 350 with full width array sensor 352 with photosensitive chips 354 with multiple sets of photosensors connected to a pixel amplifier. According to aspects illustrated herein, a photosensitive chip discussed for FIGS. 1 through 4 can be used in apparatus 350 with a full width array sensor 352 having a plurality of photosensitive chips 354 or in an apparatus with a sensor having a single photosensitive chip and, for example, with a reductive lens (not shown). According to aspects illustrated herein the method, described supra, for processing optical data from a photosensitive chip is applicable apparatus 350 with a full width array sensor 352. Returning to FIG. 5, in an example embodiment as shown in FIG. 8, a chip 354 for an apparatus similar to apparatus 200 in FIG. 5, for example, apparatus 350, includes portion 100 with multiple sets of photosensors connected to a pixel amplifier. In an example embodiment, memory element 356 for apparatus 350 with chip 354 is for storing light-induced signals from the plurality of sets of photosensors and processor 358 is for retrieving the signals and operating upon the signals to generate an image, for example, corresponding to areas 400 in FIG. 4 for a scan line. In an example embodiment, a chip for an apparatus similar to apparatus 200 in FIG. 5, for example, chip 354 in apparatus 350, includes portion 100 with multiple sets of photosensors connected to a pixel amplifier and the apparatus with the chip, for example, apparatus 350, is used to implement the method for processing optical data from a photosensitive chip. In FIG. 8, process direction P is parallel to direction Y, for example, as shown in FIG. 4. In FIG. 8, direction X, is orthogonal to direction Y, for example, as shown in FIGS. 2 and 4.

Although portion 100 is shown with a specific number of sets of photosensors and a specific number of photosensors in a set of photosensors, it should be understood that according to aspects illustrated herein, other numbers of sets of photosensors and other numbers of photosensors in a set of photosensors connected to a single electrical element, amplifier, and shift register via a multiplexing circuit are possible.

In an example embodiment, multiplexing multiple sets of photosensors with a single electrical element, pixel amplifier, and shift register is used to advantageously reduce the length of the single electrical element, pixel amplifier, and shift register. In an example embodiment, two sets of photosensors are connected a single amplifier (the general configuration in FIGS. 1 and 2). However, rather than reducing photosensor width and maintaining pixel amplifier width, the transverse width of the photosensors is maintained, for example, at about 30 microns as used for a resolution of 600 SPI, and subsequently the transverse width of the amplifier and shift register increases to a value greater than twice 30 microns. The increase in the width of the single electrical element, amplifier, and shift register results in a decrease in the Y direction of the size of a chip including the preceding example embodiment with the wider photosensor transverse widths. For example, the length in direction Y for a chip with the preceding example embodiment is less than the length in direction Y for a chip with portion 500 in FIG. 6. The decrease in direction Y can advantageously reduce cost of a chip and the footprint of the chip, which can in turn reduce the size or complexity of equipment using the chip.

Also, the preceding example embodiment with the increased width for the electrical element, amplifier, and shift register reduces the number of amplifier lines connected to downstream circuitry, such as video lines, with a subsequent increase in the data rates possible, for example, by reducing capacitance effects. Thus for example, a data rate for embodiments using portion 100 is greater than a data rate for portion 500 for equal resolutions.

Although the examples above regarding reduction of a length for a chip and increasing data rates may reference a specific number of sets of photosensors and a specific number of photosensors in a set of photosensors, it should be understood that according to aspects illustrated herein, other numbers of sets of photosensors and other numbers of photosensors for reducing a length for a chip and increasing data rates are possible.

It will be appreciated that various of the above-disclosed and other features and functions, or alternatives thereof, may be desirably combined into many other different systems or applications. Various presently unforeseen or unanticipated alternatives, modifications, variations, or improvements therein may be subsequently made by those skilled in the art which are also intended to be encompassed by the following claims.

What I claim is:

1. A photosensitive chip, comprising:
a first plurality of sets of photosensors including first and second sets of photosensors, the first and second sets each aligned in a Y direction and separated from each other in an X direction perpendicular to the Y direction; and
a second plurality of sets of photosensors including third and fourth sets of photosensors, the third and fourth sets each aligned in the Y direction and separated from each other and from the first and second sets of photosensors in the X direction, wherein:
the first and third sets of photosensors are aligned in the X direction;
the second and fourth sets of photosensors are aligned in the X direction;
each photosensor in the first and second pluralities of sets of photosensors has a length in the Y direction;
the first and third sets of photosensors are offset in the Y direction from the second and fourth sets of photosensors by a distance less than the length;
the first and second pluralities of sets of photosensors include a first number of sets;
the distance is about equal to said length of a photosensor divided by the first number;
the first and second pluralities of sets of photosensors include a first number of photosensors;
a scan line for the first and second pluralities of sets of photosensors has a time period;
respective photosensors in the first and second pluralities of sets of photosensors are activated in sequence to begin accumulating charge with respect to incident light thereon; and
a time interval between activation of two sequential photosensors in the sequence is substantially equal to the time period divided by the first number.

2. The photosensitive chip of claim 1 wherein:
each set of photosensors in the first and second pluralities of sets of photosensors includes a first number of photosensors;
a scan line for the first and second pluralities of sets of photosensors has a time period;
a first photosensor in the first and second pluralities of sets of photosensors is activated at the beginning of the time period to begin accumulating charge with respect to incident light thereon; and
activation of the remaining photosensors in the first and second pluralities of sets of photosensors to begin accumulating charge with respect to incident light thereon is delayed by a time interval substantially equal to a multiple of the time period divided by the first number multiplied by a number of sets in the first or second plurality.

3. The photosensitive chip of claim 1 further comprising:
a pixel amplifier electrically connected to the first or second plurality of sets of photosensors;
at least one multiplexing circuit electrically connected to the first or second plurality of sets of photosensors; and
at least one electrical element connected to the at least one multiplexing circuit and to the pixel amplifier, wherein the at least one multiplexing circuit is for selecting respective light-induced signals from the photosensors in a predetermined sequence and transmitting the respective light-induced signals to the pixel amplifier via the at least one electrical element.

4. The photosensitive chip of claim 3 wherein respective lines extending in the Y direction from respective outside edges of the pixel amplifier bracket the first or second plurality sets of photosensors.

5. The photosensitive chip of claim 1 wherein:
each set of photosensors in the first and second pluralities of sets of photosensors includes a first number of photosensors;
each of the photosensors in the first and second pluralities of sets of photosensors has a respective transverse width in direction X equal to a first value;
the first or the second plurality of sets of photosensors is arranged to connect to a pixel amplifier, including at least one wiring channel; and
the pixel amplifier has a transverse width, in the X direction, greater than the first value multiplied by the first number.

6. A method for processing optical data from a photosensitive chip, the chip including: a plurality of sets of photosensors arranged along an X direction, the photosensors within each set of photosensors aligned in a Y direction, perpendicular to the X direction, and the photosensors within said each set being offset, in the Y direction, relative to the photosensors of an adjacent set of photosensors, by a distance less than a length of a photosensor, comprising:
conveying a sheet of material past the chip in a process direction parallel to the Y direction; and
transmitting respective light-induced signals from the plurality of sets of photosensors in a predetermined sequence, wherein:
the chip includes:
a selection element electrically connected to the plurality of sets of photosensors; and
a pixel amplifier electrically connected to the selection element;
the transmitting respective light-induced signals from the plurality of sets of photosensors in a predetermined sequence includes transmitting, using the selection element, respective light-induced signals from the plurality of sets of photosensors to the pixel amplifier;
the plurality of sets of photosensors includes a first number of photosensors; and
a scan line for the plurality of sets of photosensors has a time period, the method further comprising activating respective photosensors in the plurality of sets of photosensors in sequence to begin accumulating charge with respect to incident light thereon, wherein a time interval between activation of two sequential photosensors in the sequence is substantially equal to the time period divided by the first number.

7. The method of claim 6 wherein:
the plurality of sets of photosensors includes a first number of photosensors; and
a scan line for the plurality of sets of photosensors has a time period, the method including:
activating a first photosensor in the plurality of sets of photosensors at the beginning of the time period to begin accumulating charge with respect to incident light thereon; and delaying activation of the remaining photosensors in the plurality of sets of photosensors to begin accumulating charge with respect to incident light thereon by a time interval substantially equal to a multiple of the time period divided by the first number.

8. The method of claim 6 wherein:
the plurality of sets of photosensors includes a plurality of groups of photosensors;
each group of photosensors includes a photosensor from each set in the plurality of sets of photosensors; and
a scan line for the plurality of sets of photosensors has a time period, the method further comprising:
initiating the scan line for the plurality of sets of photosensors; and
for each of the photosensors, detecting incident light for a respective area along a process direction parallel to the Y direction, the area having a center, wherein for each group of photosensors, a time interval, in the process direction, between respective centers for associated areas is a whole number multiple of the time period.

9. An apparatus for generating or reproducing a document, comprising:
a conveyance element for transporting a sheet of material through the apparatus in a process direction;
at least one photosensitive chip including a plurality of sets of photosensors arranged along an X direction, the photosensors within each set of photosensors aligned in a Y direction, perpendicular to the X direction and parallel to the process direction, and the photosensors within said each set being offset, in the Y direction, relative to the photosensors of an adjacent set of photosensors by a distance less than a length of a photosensor; and
a computing device for operating upon light-induced signals from the plurality of sets of photosensors, wherein:
the plurality of sets of photosensors includes a first number of sets;
a scan line for the plurality of sets of photosensors has a time period;
each photosensor in the plurality of sets of photosensors is activated in sequence to begin accumulating charge with respect to incident light thereon; and
a time interval between activation of two sequential photosensors in the sequence is substantially equal to the time period divided by the first number.

10. The apparatus of claim 9 wherein the at least one chip includes a pixel amplifier electrically connected to the plurality sets of photosensors.

11. The apparatus of claim 9 wherein:
the plurality of sets of photosensors includes a first number of sets; and
the distance is about equal to said length of a photosensor divided by the first number.

12. A photosensitive chip, comprising:
a first plurality of sets of photosensors including first and second sets of photosensors, the first and second sets each aligned in a Y direction and separated from each other in an X direction perpendicular to the Y direction; and,
a second plurality of sets of photosensors including third and fourth sets of photosensors, the third and fourth sets each aligned in the Y direction and separated from each other and from the first and second sets of photosensors in the X direction, wherein:
each photosensor in the first and second pluralities of sets of photosensors includes respective side edges aligned in the Y direction and respective end edges aligned in the X direction;
for each of the first, second, third and fourth sets of photosensors, respective first and second photosensors are filtered for first and second different colors, respectively;
the first and third sets of photosensors are aligned in the X direction;
the second and fourth sets of photosensors are aligned in the X direction;
each photosensor in the first and second pluralities of sets of photosensors has a length in the Y direction; and,
the first and third sets of photosensor are offset in the Y direction from the second and fourth sets of photosensors by a distance less than the length.

13. A method for processing optical data from a photosensitive chip, the chip including a first plurality of sets of photosensors with first and second sets of photosensors each aligned in a Y direction and separated from each other in an X direction perpendicular to the Y direction, and a second plurality of sets of photosensors including third and fourth sets of photosensors each aligned in the Y direction and separated from each other and from the first and second sets of photosensors in the X direction, the method comprising:
conveying a sheet of material past the chip in a process direction parallel to the Y direction;
filtering, for each of the first, second, third and fourth sets of photosensors, respective first and second photosensors for first and second different colors, respectively; and,
transmitting respective light-induced signals from the first and second pluralities of sets of photosensors in a predetermined sequence, wherein:
the first and third sets of photosensors are aligned in the X direction;
the second and fourth sets of photosensors are aligned in the X direction;
each photosensor in the first and second pluralities of sets of photosensors includes respective side edges aligned in the Y direction and respective end edges aligned in the X direction;
each photosensor in the first and second pluralities of sets of photosensors has a length in the Y direction; and
the first and third sets of photosensors are offset in the Y direction from the second and fourth sets of photosensors by a distance less than the length.

14. An apparatus for generating or reproducing a document, comprising:
a conveyance element for transporting a sheet of material through the apparatus in a process direction;
at least one photosensitive chip including:
a first plurality of sets of photosensors including first and second sets of photosensors, the first and second sets each aligned in a Y direction and separated from each other in an X direction perpendicular to the Y direction; and,
a second plurality of sets of photosensors including third and fourth sets of photosensors, the third and fourth sets each aligned in the Y direction and separated from each other and from the first and second sets of photosensors in the X direction; and,
a computing device for operating upon light-induced signals from the plurality of sets of photosensors, wherein:
each photosensor in the first and second pluralities of sets of photosensors includes respective side edges aligned in the Y direction and respective end edges aligned in the X direction;

for each of the first, second, third and fourth sets of photosensors, respective first and second photosensors are filtered for first and second different colors, respectively;

the first and third sets of photosensors are aligned in the X direction;

the second and fourth sets of photosensors are aligned in the X direction;

each photosensor in the first and second pluralities of sets of photosensors has a length in the Y direction; and, the first and third sets of photosensor are offset in the Y direction from the second and fourth sets of photosensors by a distance less than the length.

* * * * *